United States Patent
Lee et al.

[11] Patent Number: 5,717,226
[45] Date of Patent: Feb. 10, 1998

[54] LIGHT-EMITTING DIODES AND METHOD OF MANUFACTURING THE SAME

[75] Inventors: Biing-Jye Lee; Chuan-Ming Chang; Ming-Jiunn Jou, all of Hsinchu, Taiwan

[73] Assignee: Industrial Technology Research Institute, Taiwan

[21] Appl. No.: 715,889

[22] Filed: Sep. 18, 1996

[51] Int. Cl.$^6$ ............... H01L 27/15; H01L 31/12; H01L 33/00
[52] U.S. Cl. ............... 257/86; 257/94
[58] Field of Search ............... 257/86, 94, 455

[56] References Cited

U.S. PATENT DOCUMENTS 5,281,830  1/1994  Kotacki et al. ............... 257/86
5,488,235  1/1996  Nozaki et al. ............... 257/86

Primary Examiner—Stephen Meier
Attorney, Agent, or Firm—Rabin, Champagne & Lynt, P.C.

[57] ABSTRACT

A surface-emitting AlGaInP LED is disclosed. The manufacturing method comprises the steps of: (i) forming a buffer layer, a first type of AlGaInP cladding layer, a AlGaInP active layer, a second type of AlGaInP cladding layer, and a second type of contact layer on a first type of GaAs substrate; (ii) forming a conductive transparent electrode; (iii) by using photolithography and etching techniques, a first photoresist layer with a hole is formed on the middle above the transparent electrode; (iv) etching the portion of the transparent electrode and the second type of GaAs layer not covered by the photoresist layer until the second type of AlGaInP cladding layer; (v) forming a metal layer on the hole being etched to form a Schottky barrier; (vi) thermal annealed to thicken an native oxide formed between the metal layer and the second type of AlGaInP cladding layer to increase the Schottky barrier level; (vii) removing the first photoresist layer, and coating a back electrode on an opposite surface of the first type of GaAs substrate; (viii) employing the photolithography and etching techniques and a mask being used in the photolithography of step (iii) to form a second photoresist layer with a hole at the center thereof; and (ix) forming a second metal over the metal layer being formed on the second type of AlGaInP cladding layer at step (v). The Schottky barrier and the native oxide serve as a current-blocking layer, and the luminance of a light-emitting diode is improved.

7 Claims, 2 Drawing Sheets

LIGHT-EMITTING DIODES AND METHOD OF MANUFACTURING THE SAME

BACKGROUND OF THE INVENTION

1. Field of the Invention

The present invention relates to the structure of a light-emitting diode (LED) and method of manufacturing the same, which uses the contact between the bonding metal and the semiconductor as a Schottky barrier to block and spread the current therein.

2. Description of Prior Art

The AlGaInP alloy system, which is a semiconductor with a direct energy bandgap, has been used for making high quality semiconductor lasers with an emitting wavelength of around 670 nanometers. This alloy system may also be useful for making light-emitting diodes (LEDs) for wavelengths ranging from about 560 to 680 nanometers by adjusting the aluminum to gallium ratio in the active region of the device. Increasing the aluminum composition produces shorter wavelengths. The AlGaInP substance has an unvarying lattice constant matched with the GaAs substrate while the ratio of aluminum and gallium is varied. It has also been demonstrated that metalorganic vapor phase epitaxy (MOVPE) provides a means for growing optically efficient AlGaInP hetero-structural devices.

A general structure adopted for the AlGaInP double hetero-structure LED is: forming a GaAs buffer layer on an n-type GaAs substrate, forming an n-type AlGaInP cladding layer on a GaAs buffer layer; then growing an undopad AlGaInP active layer thereon; and growing a p-type AlGaInP cladding layer on the AlGaInP active layer. The light-emitting efficiency of the AlGaInP LED described above does not depend only on the recombination rate of the electrons and the holes in the active layer, but also on the efficiency of current spreading in the upper cladding layer. This is, for efficient operation of the LED, current injected by the front electrical contact should be spread efficiently in the lateral direction so that the current will cross the p-n junction of the double hetero-structure of AlGaInP uniformly to thereby generate light evenly. The p-type AlGaInP layer, which is grown by means of the MOVPE process, is very difficult to dope with acceptors of a concentration higher than 1E18 $cm^{-3}$. Moreover, it is a material characteristic that hole mobility is low in p-type AlGaInP semiconductors (about 10 to 20 $cm^2 \times V/sec$). Due to these two factors, the electrical resistivity of the p-type AlGaInP layer is comparatively high (i.e., about 0.5 $\Omega$-cm) so that current spreading is severely restricted. As a result, the current tends to be restricted around under the front electrical contact. This is often referred to as current crowding.

Some different structures have been developed to solve the above-mentioned problems in the prior-art LED.

One technique to solve the current crowding problem is disclosed by Fletcher et al in a U.S. Pat. No. 5,008,718 and in the Journal of Electronic Materials, Vol. 20, No. 12, 1991, pp. 1125–1130. The proposed LED structure is shown in FIG. 1, wherein the device geometry of a conventional LED is fabricated with a back electrical contact 15, a substrate of n-type GaAs 10, a double hetero-structure of AlGaInP, which includes a layer of n-type AlGaInP 11, a layer of undoped AlGaInP 12, and a layer of p-type AlGaInP 13, and a front electrical contact 16, in which a semiconductor window layer 14 is grown upon the p-type AlGaInP layer 13. The window layer 14 should be selected from materials that have low electrical resistance so that the current can spread out quickly, and a bandgap higher than that of the AlGaInP layers so that the window layer is transparent to light-emitted from the active layer of AlGaInP.

In an LED for generating light in the spectrum from red to yellow, an AlGaAs substance is selected to form the window layer 14. The AlGaAs substance has the advantage of having a lattice constant matched with that of the underlying GaAs substrate 10. In an LED for generating light in the spectrum from yellow to green, a GaAsP or GaP substance is used to form the window layer 14. A drawback of using GaAsP or GaP substances that their lattice constants are not matched with those of the AlGaInP layers 11 to 13 and the GaAs substrate 10. This lattice mismatch causes a high dislocation density that may affect LED□ long-term reliability. In addition, the window layer has to be grown with a thickness of 5 to several ten micrometers to evenly spread the current. This increases the time and complexity for manufacturing an LED due to two-step growth procedures, namely, a MOVPE procedure for growing the AlGaInP double hetero-structure and a vapor o phase epitaxy (VPE) procedure for growing the thick window layer.

FIG. 2 shows a second prior art LED disclosed in U.S. Pat. No. 5,048,035 by Sugawara et al. The LED shown in FIG. 2 includes a back electrical contact 28, a GaAs substrate 20, an n-type AlGaInP cladding layer 21, an undoped AlGaInP active layer 22, a p-type AlGaInP cladding layer 23, a Bragg reflector layer 24, a current-blocking layer 25, a current spreading layer 26, an ohmic contact layer 27, and a front electrical contact 29. The current spreading layer 26 has very low electrical resistance and the current-blocking layer 25 is arranged at a position where it is in alignment with the front electrical contact 29 and thus is spread out laterally by the current-blocking layer 25. Moreover, the reflector layer 24 can be used to prevent the light-emitted by the active layers from being absorbed by the GaAs substrate 20.

A drawback of the LED as shown in FIG. 2 is that the fabricating process, in which the MOVPE procedure needs to be performed twice, is very complex for LED fabrication. Moreover, the p-type AlGaInP layer 23 tends to be oxidized since it contains high aluminum content.

SUMMARY OF THE INVENTION

Thus, the primary object of the present invention is to provide a structure of a double hereto-structure surface light-emitting diode and a method for manufacturing the same, which overcomes the drawbacks and disadvantages associated with the aforementioned prior arts.

Another object of the present invention is to provide a structure of a double hetero-structure surface light-emitting diode in which the contact between the bonding metal and the semiconductor serves as a Schottky barrier to block the current under the front electrode.

One aspect of the present invention is that procedures for growing the window layer or current-blocking layer are no longer necessary, so that the manufacturing procedures can be simplified and the time for manufacturing can be reduced.

Another aspect of the present invention is utilizing a material with good conductivity, as well as good transparency from red light to green light, to serve as the window layer, thus improves light-emitting characteristic and enhances light-emitting performance.

To achieve the above objects, the present invention uses the Schottky barrier formed between semiconductor and metal as a current-blocking layer, and utilizes the native oxide, which is formed while annealing the transparent electrode, to increase the level of the Schottky barrier. Thus, the current from the electrode is evenly distributed so that the light-emitting performance is enhanced.

BRIEF DESCRIPTION OF THE DRAWING

The present invention can be more fully understood by reading the subsequent detailed description of the preferred embodiment thereof with references made to the accompanying drawings, wherein.

In all of the Figures, identical reference numeral represents the same or similar component of the light-emitting diode utilized for the description of the present invention.

DETAILED DESCRIPTION OF THE PREFERRED EMBODIMENTS

Figure 1:
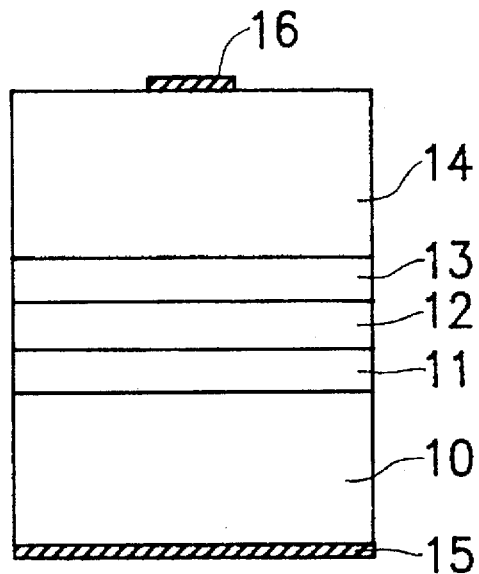
FIG. 1 is a sectional illustration of a first prior art LED.
Figure 2:
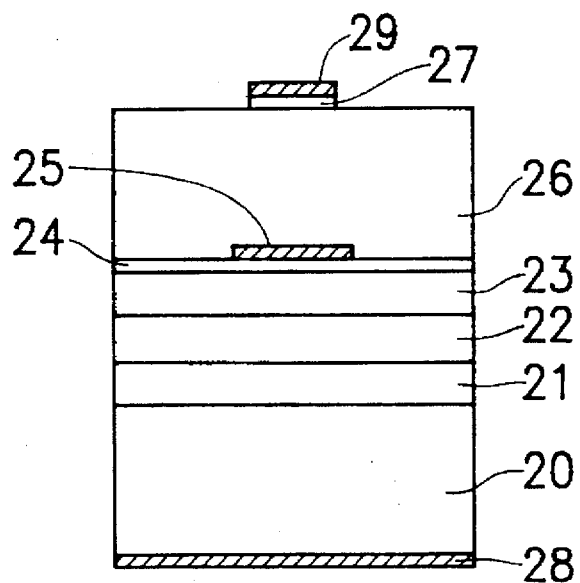
FIG. 2 is a sectional illustration of a second prior art LED.
Figure 3A:
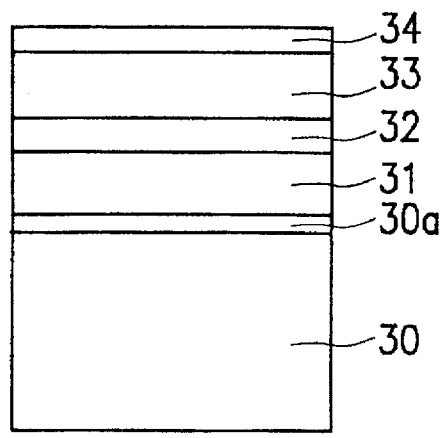
FIGS. 3a to 3c are sectional illustrations of manufacturing an LED in accordance with a preferred embodiment of the present invention.
Figure 3B:
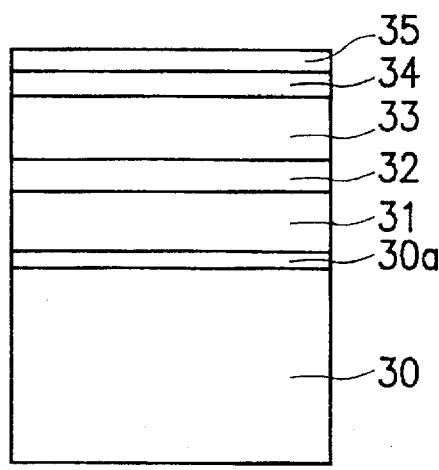
Figure 3C:
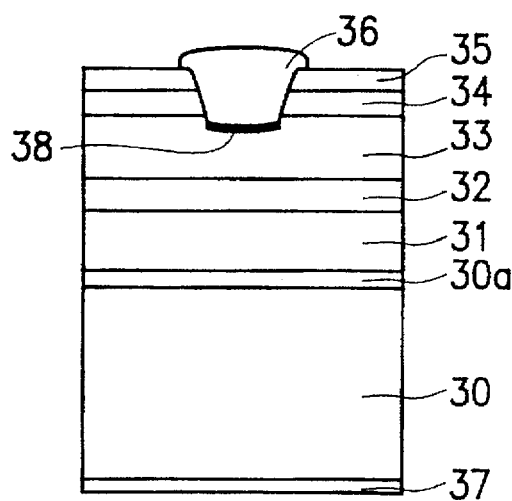

Referring to FIGS. 3a to 3c, the method for manufacturing a light-emitting diode according to one preferred embodiment of the present invention, comprises the steps of: (i) Referring to FIG. 3a, sequentially forming a GaAs buffer layer 30a, a double hetero-structure of AlGaInP, which includes an n-type AlGaInP cladding layer 31, an active AlGaInP layer 32 and a p-type AlGaInP cladding layer 33, and a p-type contact layer 34, such as GaAs or AlGaAs, on an n-type GaAs substrate 30; (ii) referring to FIG. 3b, coating a transparent electrode 35 having a high conductivity, such as ITO (indium tin oxide) or ZnO, to function as a current spreading layer; (iii) referring to FIG. 3c, by using photolithography and etching techniques, a first photoresist layer with a pattern, for example, a round hole formed at the central position thereof, can be formed above the transparent electrode 35, the portion of the transparent electrode 35 and the p-type contact layer 34 not covered by the photoresist layer being etched down to the p-type AlGaInP cladding layer 33, then a metal layer, such as AuBe/Au or AuZn/Au, being formed thereon to form a Schottky barrier between the metal layer and the p-type AlGaInP cladding layer 33, then removing the first photoresist layer, and coating a back electrode 37 on an opposite surface of the first type of GaAs substrate 30, (iv) referring to Figure 3c, employing the photolithography and etching techniques and a mask being used in the above photolithography step again to form a second photoresist layer with a hole at the center thereof, forming a second metal 36 over the metal layer being formed on the p-type AlGaInP cladding layer 33, and finally removing the second photoresist layer.

A native oxide layer 38 is formed between the metal 36 and the p-type AlGaInP cladding layer 33, and is thickened to increase the Schottky barrier level while annealing the transparent electrode 35.

In the above manufacturing method of the present invention, the process of FIG. 3a is performed by using MOVPE. In the process of FIG. 3b, before forming the transparent electrode 35, the chip of the epitaxy layers has to be cleaned, and the oxide formed on its surface has to be previously removed by etching. Then the transparent electrode 35 is formed on the p-type contact layer 34 by e-beam coating. Regarding to the process of FIG. 3c, the Schottky barrier is formed between the metal layer and the semiconductor (i.e., the p-type AlGaInP cladding layer 33), and the native oxide 38 is thickened to increase the Schottky barrier level so that the current-blocking layer is formed by the Schottky barrier and the native oxide.

In the above photolithography and etching process, a chemical etching manner is employed, in which HCl is used as the etching solution and the etching rate can be set at about 1 μm/min.

Furthermore, the material of the metal 36 can be a variety of choices corresponding to the material of the semiconductor in contact with the metal 36. For example, it can be the combination of AlGaAs or AlGaInP and Ti/Pt/Au, AuBe/Au or AuZn/Au. In the present invention, the combination of AlGaInP and AuZn/Au is preferred.

Referring to FIG. 3c, according to the above description, the light-emitting diode of the present invention includes: an n-type GaAs substrate 30; a GaAs buffer layer 30a formed on the n-type GaAs substrate 30; an n-type AlGaInP cladding layer 31 formed on the GaAs buffer layer 30a; an undopad AlGaInP active layer 32 formed on the n-type AlGaInP cladding layer 31; a p-type AlGaInP cladding layer 33 formed on the AlGaInP active layer 32; a p-type contact layer 34 formed on the p-type AlGaInP cladding layer 33; a transparent electrode 35 formed on the p-type contact layer 34; a metal 36 formed on a hole and contacting the p-type AlGaInP cladding layer 33 to form the Schottky barrier, in which the hole is formed in a photolithography and etching process; a back electrode 37 formed on the opposite side of the n-type GaAs substrate 30; and a native oxide 38, formed between the p-type AlGaInP cladding layer 33 and the metal 36, being thickened while annealing the transparent electrode 35 to increase the Schottky barrier level.

What is claimed is:

1. A light-emitting diode comprising:

a first type of GaAs substrate;

a GaAs buffer layer formed on the first type of GaAs substrate;

a first type of AlGaInP cladding layer formed on the GaAs buffer layer;

an AlGaInP active layer formed on the first type of AlGaInP cladding layer;

a second type of AlGaInP cladding layer formed on the AlGaInP active layer;

a second type of contact layer formed on the second type of AlGaInP cladding layer;

a transparent electrode formed on the second type of contact layer;

a metal formed on a hole and contacting the second type of AlGaInP cladding layer to form a Schottky barrier, in which the hole is formed by a photolithography and etching process;

a back electrode formed on the opposite side of the first type of GaAs substrate.

2. The light-emitting diode as claimed in claim 1, further comprising: a native oxide, being formed between the second type of AlGaInP cladding layer and the metal while annealing the transparent electrode, to increase the Schottky barrier level.

3. The light-emitting diode as claimed in claim 1 wherein the transparent electrode is made of ZnO.

4. The light-emitting diode as claimed in claim 1 wherein the transparent electrode comprises indium tin oxide.

5. The light-emitting diode as claimed in claim 1 wherein the first type is n-type and the second type is p-type.

6. The light-emitting diode as claimed in claim 1 wherein the second type of contact layer comprises AlGaAs.

7. The light-emitting diode as claimed in claim 1 wherein the second type of contact layer comprises GaAs.

* * * * *